(12) United States Patent
Takekawa

(10) Patent No.: US 6,466,065 B1
(45) Date of Patent: Oct. 15, 2002

(54) PRESCALER AND PLL CIRCUIT

(75) Inventor: Koji Takekawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/667,555

(22) Filed: Sep. 22, 2000

(30) Foreign Application Priority Data

Nov. 1, 1999 (JP) .......................................... 11-311636

(51) Int. Cl.[7] .......................... H03H 11/16; H03K 21/00
(52) U.S. Cl. ...................... 327/115; 327/231; 327/159; 331/25
(58) Field of Search .................. 327/157, 156, 327/159, 231, 113, 115; 377/52; 331/1 A, 25

(56) References Cited

U.S. PATENT DOCUMENTS

| | | | | |
|---|---|---|---|---|
| 4,468,797 A | * | 8/1984 | Shin ............................. 377/52 |
| 5,581,214 A | * | 12/1996 | Iga .............................. 327/159 |
| 5,640,116 A | * | 6/1997 | Kobayashi et al. ......... 327/231 |
| 6,031,425 A | * | 2/2000 | Hasegawa ................... 327/231 |
| 6,163,181 A | * | 12/2000 | Nishiyama .................. 327/115 |

FOREIGN PATENT DOCUMENTS

| JP | 2-132918 | 5/1990 |
|---|---|---|
| JP | 3101312 | 4/1991 |

* cited by examiner

*Primary Examiner*—Dinh T. Le
(74) *Attorney, Agent, or Firm*—Arent Fox Kintner Plotkin & Kahn, PLLC

(57) ABSTRACT

A prescaler having a frequency division shifting circuit for shifting a frequency division ratio in response to a frequency division ratio shifting signal, and dividing an input signal in accordance with the shifted frequency division ratio to generate a first divisional signal. The prescaler also includes an extender circuit connected to a frequency division shifting circuit for dividing the frequency of the first divisional signal with a predetermined frequency division ratio to generate a second divisional signal. The extender circuit contains a synchronous counter.

6 Claims, 14 Drawing Sheets

PRESCALER AND PLL CIRCUIT

BACKGROUND OF THE INVENTION

The present invention relates to a prescaler and a PLL circuit, and more specifically, to a PLL circuit that matches an output signal frequency with a predetermined frequency.

Phase-locked loop (PLL) circuits are used in mobile communication devices, such as cellular telephones. To improve the performance of the mobile communication device, a PLL circuit must quickly shift an output signal frequency to the desired frequency. Accordingly, it is required that the lockup time of the PLL circuit be decreased.

FIG. 1 is a schematic block diagram showing a prior art PLL circuit. The PLL circuit includes an oscillator 1, which generates a reference clock signal CK having an inherent frequency corresponding to the oscillation of a crystal oscillating element. The clock signal CK is provided to a reference frequency divider 2. The reference frequency divider 2 includes a counter circuit, divides the frequency of the reference clock signal CK in accordance with a division ratio determined by a shift register 3 to generate a reference signal fr, and provides the reference signal fr to a phase comparator 4.

The phase comparator 4 provides a charge pump 6 with pulse signals ΦR, ΦP corresponding to the frequency difference or phase difference between the reference signal fr and a comparison signal fp.

The charge pump 6 provides an output signal SCP corresponding to the pulse signals ΦR, ΦP to a low-pass filter (LPF) 7.

The output signal SCP has DC components, which include pulse components. The DC components shift in accordance with the frequency fluctuation of the pulse signals ΦR, ΦP, and the pulse components shift in accordance with the phase difference of the pulse signals ΦR, ΦP.

The LPF 7 smoothes and eliminates high frequency components from the output signal SCP of the charge pump 6 to generate an output signal SLPF, which is provided to a voltage-controlled oscillator (VCO) 8.

The VCO 8 generates an oscillation output signal fvco, which has a frequency corresponding to the voltage value of the output signal SLPF of the LPF 7, and provides the oscillation output signal fvco to an external circuit and a comparison frequency divider 5.

The comparison frequency divider 5 is a pulse-swallow type, and includes a prescaler 9, a main counter 10, a swallow counter 11, and a control circuit 12.

The prescaler 9 divides the frequency of the input signal (the oscillation output signal fvco of the VCO 8) by M or by (M+1) to generate a prescaler divisional signal Pout. Then, the prescaler 9 provides the prescaler divisional signal Pout to the main counter 10 and the swallow counter 11.

The swallow counter 11 divides the prescaler divisional signal Pout by A and provides a swallow counter divisional signal to the control circuit 12. In accordance with the swallow counter divisional signal, the control circuit 12 provides the prescaler 9 with, for example, a high module control signal MD. In accordance with the module control signal MD, the prescaler 9 divides the frequency of the oscillation output signal fvco by M to output the prescaler divisional signal Pout.

While the swallow counter 11 is counting an A number of pulses, the control circuit 12 provides the prescaler 9 with, for example, a low module control signal MD. In accordance with the module control signal MD, the prescaler 9 divides the frequency of the oscillation output signal fvco by (M+1) to output the prescaler divisional signal Pout.

The shift register 3 determines a division ratio N of the main counter 10. The main counter 10 divides the frequency of the prescaler divisional signal Pout by N to generate the comparison signal fp and provides the comparison signal fp to the phase comparator 4. The divisional signal (comparison signal) fp of the main counter 10 is also provided to the control circuit 12. The control circuit 12 provides the swallow counter 11 with an activation signal each time the main counter 10 divides the frequency of the prescaler divisional signal Pout by N.

Accordingly, every time the main counter 10 divides the prescaler divisional signal Pout by N in the above PLL circuit, the swallow counter 11 is activated and the prescaler divisional signal Pout is counted.

FIG. 2 is a schematic circuit diagram showing the prior art prescaler 9. The oscillation output signal fvco of the VCO 8 is input to synchronous flip-flop circuits FF1, FF2, FF3, which form a frequency division shifting circuit C, as input signals CK, XCK through a buffer circuit 13. It is preferred that each of the flip-flop circuits FF1–FF3 be a D flip-flop (delay flip-flop) circuit.

The flip-flop circuit FF1 provides output signals QH, XQH as data XD, D, respectively, to the flip-flop circuit FF2. The flip-flop circuit FF2 provides its QH output signal to a first input terminal of an OR circuit 14a and its XQH output signal to a first input terminal of an OR circuit 14b.

The OR circuit 14a provides an output signal as data to the flip-flop circuit FF1. The OR circuit 14b provides an output signal as data to the flip-flop circuit FF3. The flip-flop circuit FF3 provides its output signal XQH to a second input terminal of the OR circuit 14a.

Two T-type flip-flop circuits TFF1, TFF2, which form an asynchronous extender circuit E, are provided. The flip-flop circuit FF1 provides its XQ output to the flip-flop circuit TFF1 as its CK input signal.

The flip-flop circuit TFF1 provides its output signal Q as the input signal CK to the flip-flop circuit TFF2. The flip-flop circuit TFF2 provides its output signal Q to a buffer circuit 15. The buffer circuit 15 outputs the prescaler divisional signal Pout.

A bias circuit 16 provides the input signal XCK, which has a constant voltage, to the flip-flop circuits TFF1, TFF2.

The output signals QH of the flip-flop circuits TFF1, TFF2 are provided to first and second input terminals of an OR circuit 14c. A third input terminal of the OR circuit 14c is provided with the module control signal MD. The OR circuit 14c provides its output signal OR to a second input terminal of the OR circuit 14b.

The flip-flop circuits TFF1, TFF2 are each configured as shown in FIG. 3. The flip-flop circuits TFF1, TFF2 each invert the output signal Q and complementary output signals QH, XQH whenever the clock signal CK goes high. Accordingly, the flip-flop circuits TFF1, TFF2 divide the output signal XQ of the flip-flop circuit FF1 by four.

FIG. 4 is a timing chart showing the operation of the prescaler 9. When the prescaler 9 is provided with the oscillation output signal fvco of the VCO 8, the operation of the flip-flop circuits FF1, FF2 causes the flip-flop circuit FF1 to divide the oscillation output signal fvco by four and generate the output signal XQ.

The output signal Q of the flip-flop circuit TFF1 is generated by dividing the output signal XQ of the flip-flop circuit FF1 by two, that is, by dividing the oscillation output signal fvco by eight. Further, the output signal Q of the flip-flop circuit TFF2 is generated by dividing the oscillation output signal fvco by sixteen.

When the module control signal MD is low, the output signal OR of the OR circuit 14c is determined by the QH output signals of the flip-flop circuits TFF1, TFF2.

Until the prescaler 9 counts twelve pulses of the oscillation output signal fvco from a count initiation point SP, at least one of the output signals QH of the flip-flop circuits TFF1, TFF2 is high. Thus, the output signal OR of the OR circuit 14c is high. In this state, the output signal XQH of the flip-flop circuit FF3 is fixed at a low level.

When the prescaler 9 counts twelve pulses of the oscillation output signal fvco, the output signals QH of the flip-flop circuits TFF1, TFF2 both go low. Thus, the output signal OR of the OR circuit 14c goes low. In this state, the flip-flop circuit FF3 is activated. Thus, the operation of the flip-flop circuits FF1–FF3 causes the flip-flop circuit FF1 to generate the output signal XQ by dividing the input signal fvco by five.

Accordingly, when the module control signal MD is low, the prescaler 9 divides the oscillation signal fvco by (M+1), or by seventeen.

When the module control signal MD is high, the output signal OR of the OR circuit 14c is fixed to a high level. Thus, the flip-flop circuit FF3 is de-activated and the output signal XQH is fixed at a low level. Accordingly, if the module control signal MD is high, the prescaler 9 divides the oscillation signal fvco by M, or by sixteen.

In the PLL circuit, when the dividing operation of the swallow counter 11 is initiated, the module control signal MD goes low, and the prescaler 9 divides the oscillation signal fvco by (M+1).

In the prescaler 9, however, a time delay Td occurs from when the division by (M+1) is initiated at the count initiation point SP to when the module control signal MD falls. The time delay Td is determined by adding the operation delay times of the extender circuit E of the prescaler 9, the swallow counter 11, and the control circuit 12. The ratio of the operation delay time of the flip flop circuits TFF1, TFF2 in the delay time Td is large.

The delay time Td is substantially constant regardless of the frequency of the oscillation output signal fvco provided by the prescaler 9. Thus, a margin time Tm decreases as the frequency of the oscillation output signal fvco increases.

When the frequency of the oscillation output signal fvco increases and the delay time Td becomes longer than one cycle of the output signal Q of the flip-flop circuit TFF2, the prescaler 9 cannot perform the (M+1) division. As a result, the lock-up operation based on the frequency obtained by the (M+1) division cannot be performed.

SUMMARY OF THE INVENTION

It is an object of the present invention to provide a prescaler and a PLL circuit incorporating the prescaler that prevents abnormal functioning when switching the division ratio.

To achieve the above object, the present invention provides a prescaler including a frequency division shifting circuit for shifting a frequency division ratio in response to a frequency division ratio shifting signal and dividing an input signal in accordance with the shifted frequency division ratio to generate a first divisional signal. An extender circuit is connected to the frequency division shifting circuit to divide the frequency of the first divisional signal with a predetermined frequency division ratio and generate a second divisional signal. The extender circuit includes a synchronous counter.

A further aspect of the present invention provides a prescaler including a frequency division shifting circuit for shifting a frequency division ratio in response to a frequency division ratio shifting signal and dividing an input signal in accordance with the shifted frequency division ratio to generate a first divisional signal. An extender circuit is connected to the frequency division shifting circuit to divide the frequency of the first divisional signal with a predetermined frequency division ratio and generate a second divisional signal. The extender circuit includes an asynchronous counter connected to a synchronous counter.

Another aspect of the present invention provides a PLL circuit including a reference frequency divider for dividing the frequency of a reference clock signal to generate a reference signal. A phase comparator is connected to the reference frequency divider to compare a phase of the reference signal with a phase of a comparison signal to generate a phase comparison signal. A charge pump is connected to the phase comparator to convert the phase comparison signal to a voltage signal. A low-pass filter is connected to the charge pump to smooth the voltage signal and generate a smooth signal. A voltage-controlled oscillator is connected to the low-pass filter to generate an oscillation output signal having a frequency corresponding to the voltage of the smooth signal. A comparison frequency divider is connected to the voltage-controlled oscillator and the phase comparator to divide the frequency of the oscillation output signal and generate the comparison signal. The comparison frequency divider includes a prescaler for dividing the frequency of the oscillation output signal with a frequency division ratio corresponding to a module control signal to generate a prescaler divisional signal. A main counter is connected to the prescaler to divide the frequency of the prescaler divisional signal and generate the comparison signal. A swallow counter is connected to the prescaler to divide the frequency of the prescaler divisional signal and generate a swallow counter divisional signal. A control circuit is connected to the swallow counter and the main counter to generate the module control signal in accordance with the comparison signal and the swallow counter divisional signal. The prescaler includes a frequency division shifting circuit for shifting the frequency division ratio in response to a frequency division ratio shifting signal and dividing an input signal in accordance with the shifted frequency division ratio to generate a first divisional signal. An extender circuit is connected to the frequency division shifting circuit to divide the frequency of the first divisional signal with a predetermined frequency division ratio and generate a second divisional signal. The extender circuit includes a synchronous counter.

A further aspect of the present invention provides a PLL circuit including a reference frequency divider for dividing the frequency of a reference clock signal to generate a reference signal. A phase comparator is connected to the reference frequency divider to compare a phase of the reference signal with a phase of a comparison signal and generate a phase comparison signal. A charge pump is connected to the phase comparator to convert the phase comparison signal to a voltage signal. A low-pass filter is connected to the charge pump to smooth the voltage signal and generate a smooth signal. A voltage-controlled oscillator is connected to the low-pass filter to generate an oscillation output signal having a frequency corresponding to the voltage of the smooth signal. A comparison frequency divider is connected to the voltage-controlled oscillator and the phase comparator to divide the frequency of the oscillation output signal and generate the comparison signal. The comparison frequency divider includes a prescaler for dividing the frequency of the oscillation output signal with a frequency division ratio corresponding to a module control signal to generate a prescaler divisional signal. A main counter is connected to the prescaler to divide the frequency of the prescaler divisional signal and generate the comparison signal. A swallow counter is connected to the prescaler to divide the frequency of the prescaler divisional signal and generate a swallow counter divisional signal. A control circuit is connected to the swallow counter and the main counter to generate the module control signal in accordance with the comparison signal and the swallow counter divisional signal. The prescaler includes a frequency division shifting circuit for shifting the frequency division ratio in response to a frequency division ratio shifting signal and dividing an input signal in accordance with the shifted frequency division ratio to generate a first divisional signal. An extender circuit is connected to the frequency division shifting circuit to divide the frequency of the first divisional signal with a predetermined frequency division ratio and generate a second divisional signal. The extender circuit includes an asynchronous counter connected to a synchronous counter.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
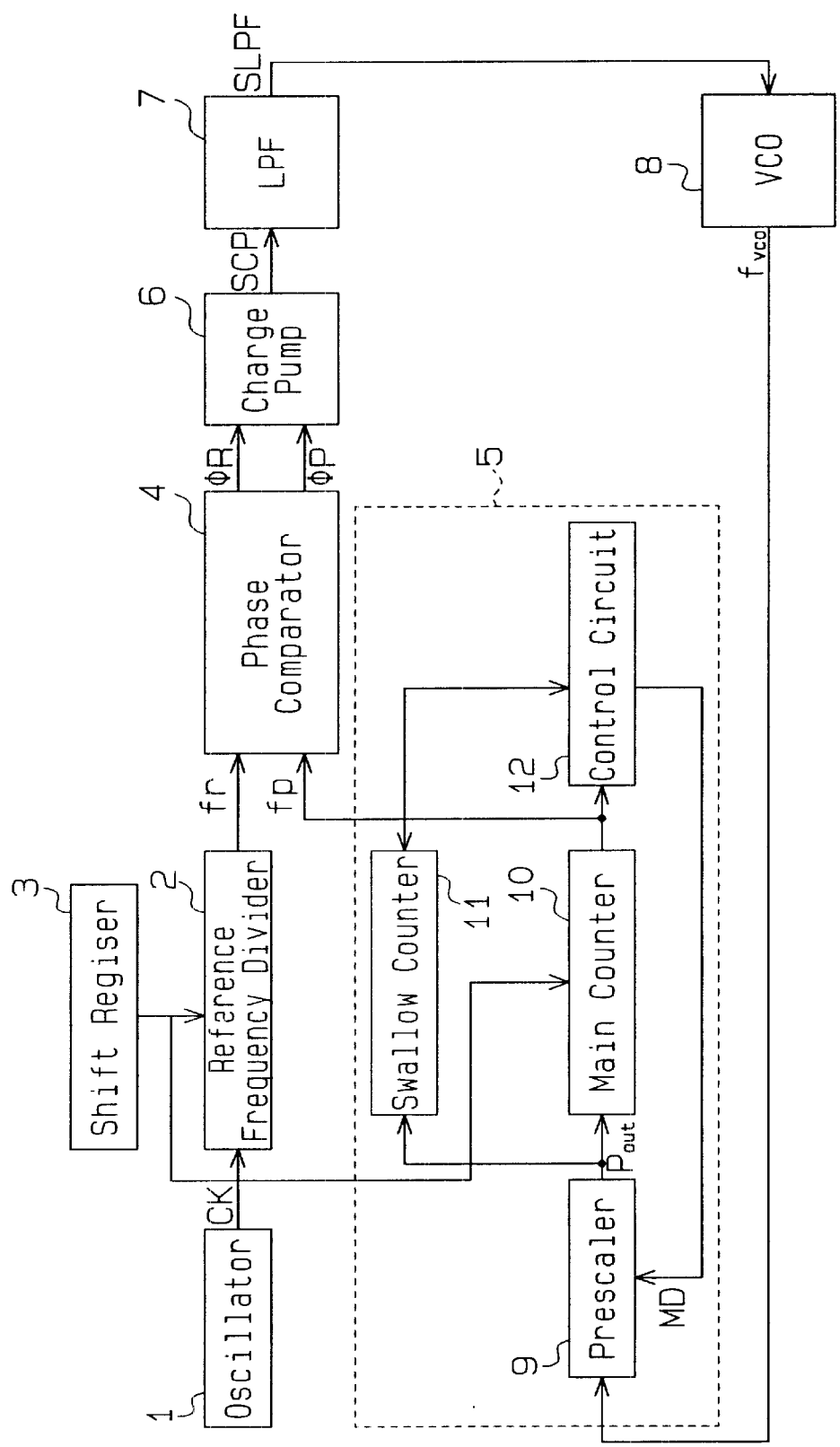
FIG. 1 is a schematic block diagram of a prior art PLL circuit.
Figure 2:
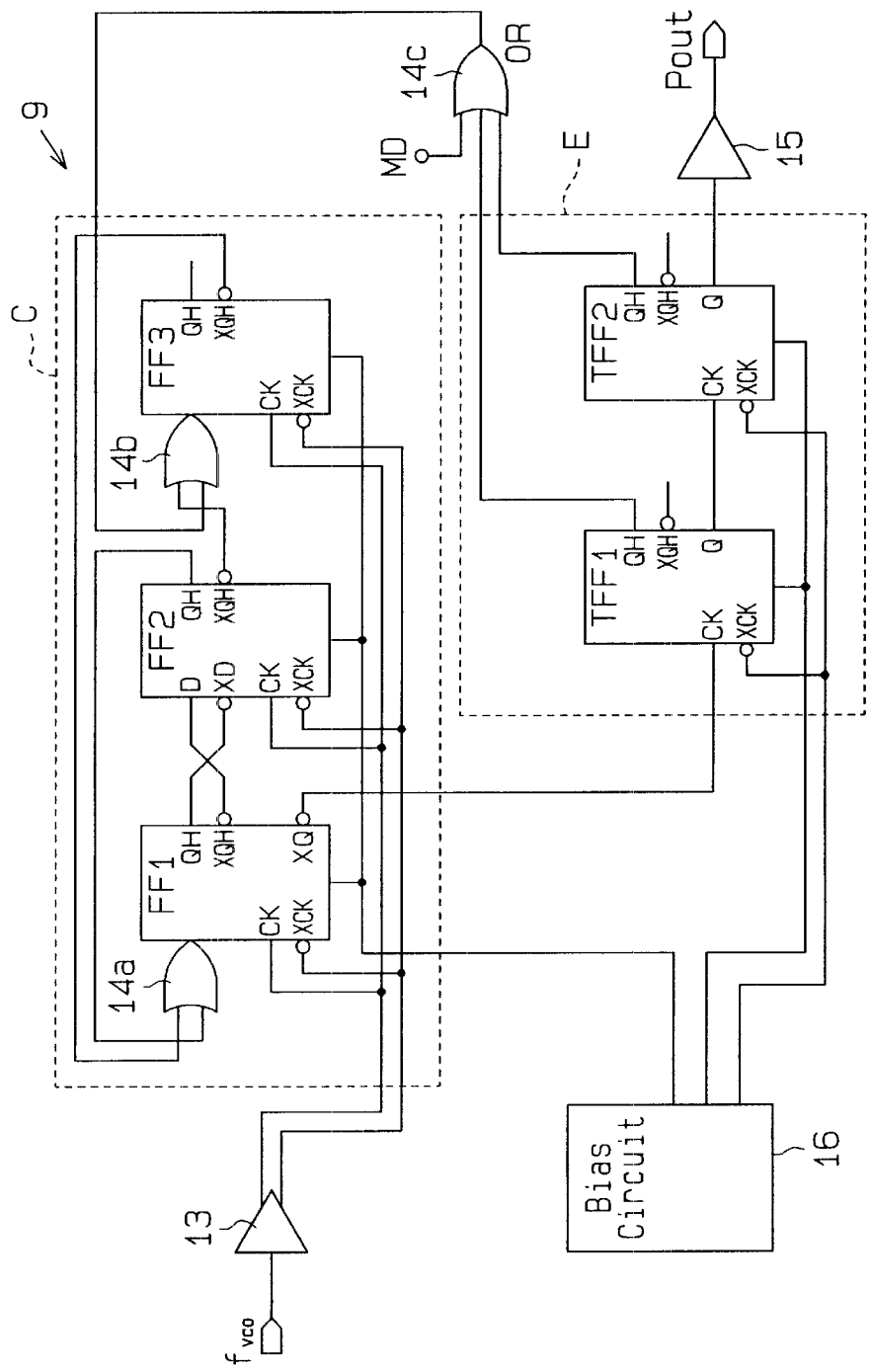
FIG. 2 is a schematic block diagram of a prescaler of the PLL circuit of FIG. 1.
Figure 3:
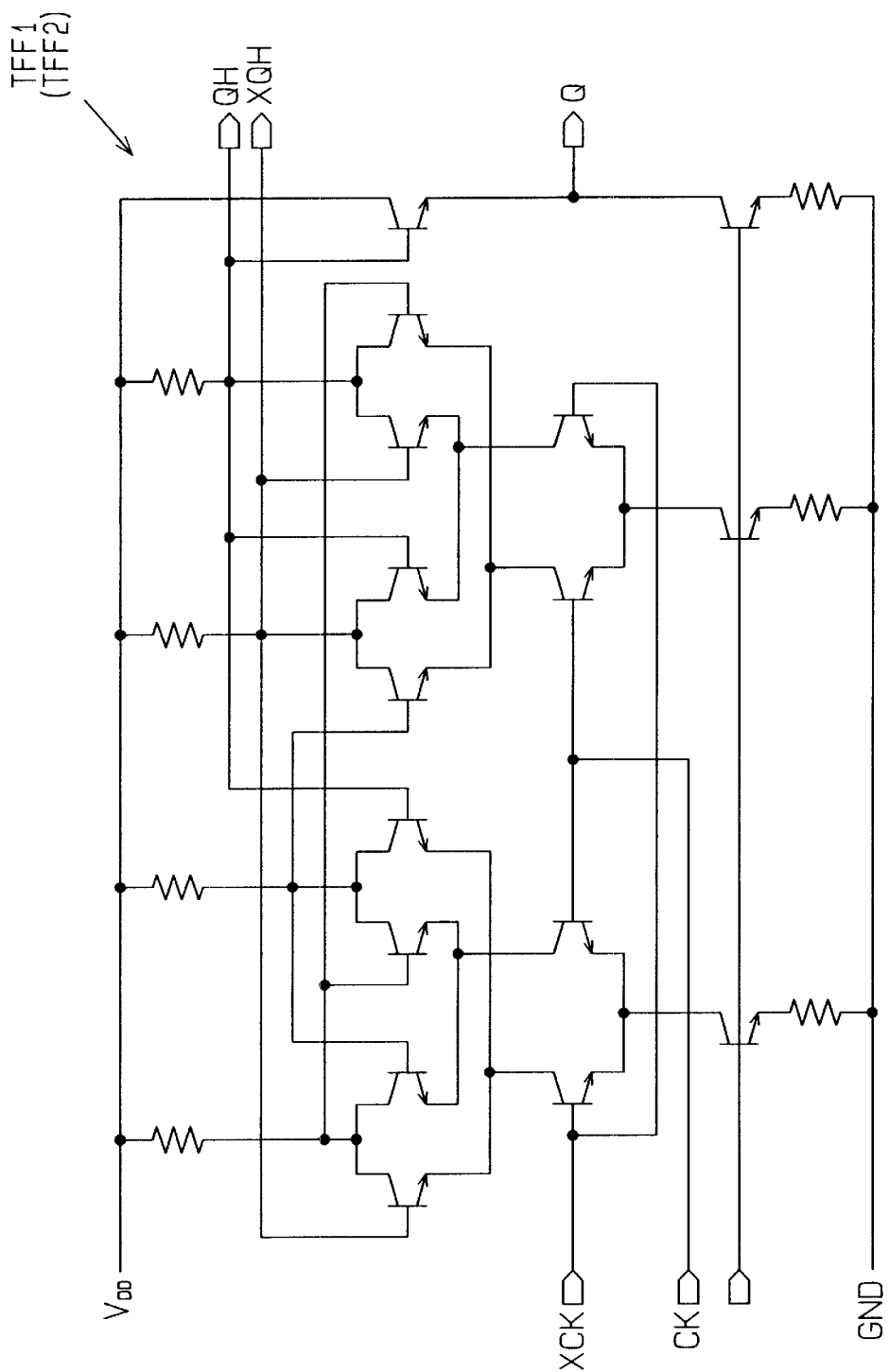
FIG. 3 is a schematic circuit diagram of a T flip-flop circuit of the prescaler of FIG. 2.
Figure 4:
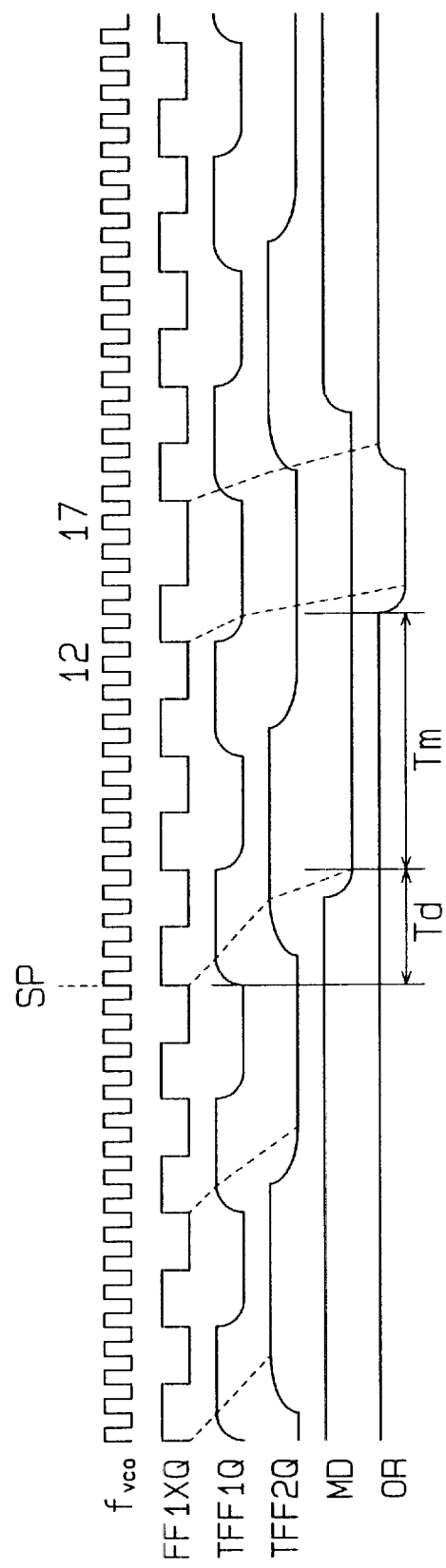
FIG. 4 is a timing chart showing the operation of the prescaler of FIG. 2.

In the drawings, like numerals are used for like elements throughout.

[First Embodiment]

Figure 5:
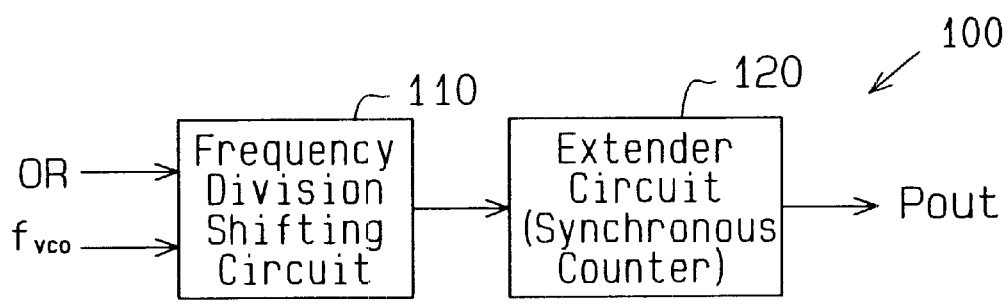
FIG. 5 is a schematic block diagram of a prescaler according to a first embodiment of the present invention.

FIG. 5 is a schematic block view showing a prescaler 100 according to a first embodiment of the present invention.

The prescaler 100 includes a frequency division shifting circuit 110, which divides the input signal fvco and shifts the division ratio in response to a frequency division ratio shifting signal OR, and an extender circuit 120, which divides an output signal of the frequency division shifting circuit 110 by a predetermined division ratio. It is preferred that the extender circuit 120 includes a synchronous counter, which shortens the operation time delay of the extender circuit 120.

[Second Embodiment]

Figure 6:
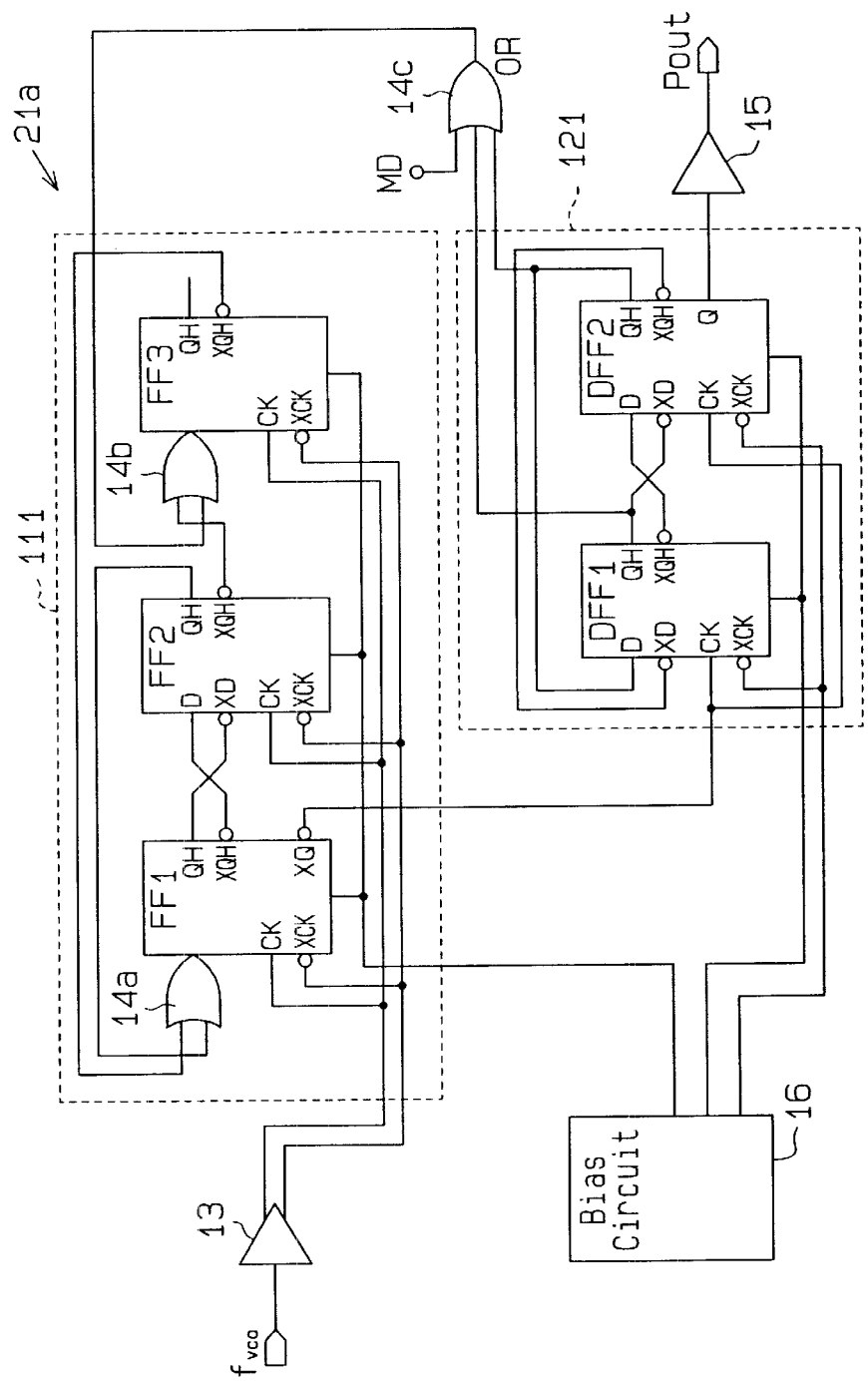
FIG. 6 is a schematic block diagram showing a prescaler according to a second embodiment of the present invention.

FIG. 6 is a schematic block diagram showing a prescaler 21a according to a second embodiment of the present invention.

The prescaler 21a has an extender circuit 121, which includes two D flip-flop circuits DFF1, DFF2.

A flip-flop circuit FF1 of a frequency division shifting circuit 111 generates an output signal XQ, which is provided to each of the D flip-flop circuits DFF1, DFF2 as an input signal CK.

Complementary output signals QH, XQH of the D flip-flop circuit DFF1 are respectively provided to the D flip-flop circuit DFF2 as complementary input signals XD, D. Complementary output signals QH, XQH of the D flip-flop circuit DFF2 are respectively provided to the D flip-flop circuit DFF1 as input signals D, XD.

The output signals QH of the D flip-flop circuits DFF1, DFF2 are provided to first and second input terminals of an OR circuit 14c. An output signal Q of the D flip-flop circuit DFF2 is provided to an output buffer circuit 15. The output buffer circuit 15 outputs a prescaler divisional signal Pout.

Figure 7:
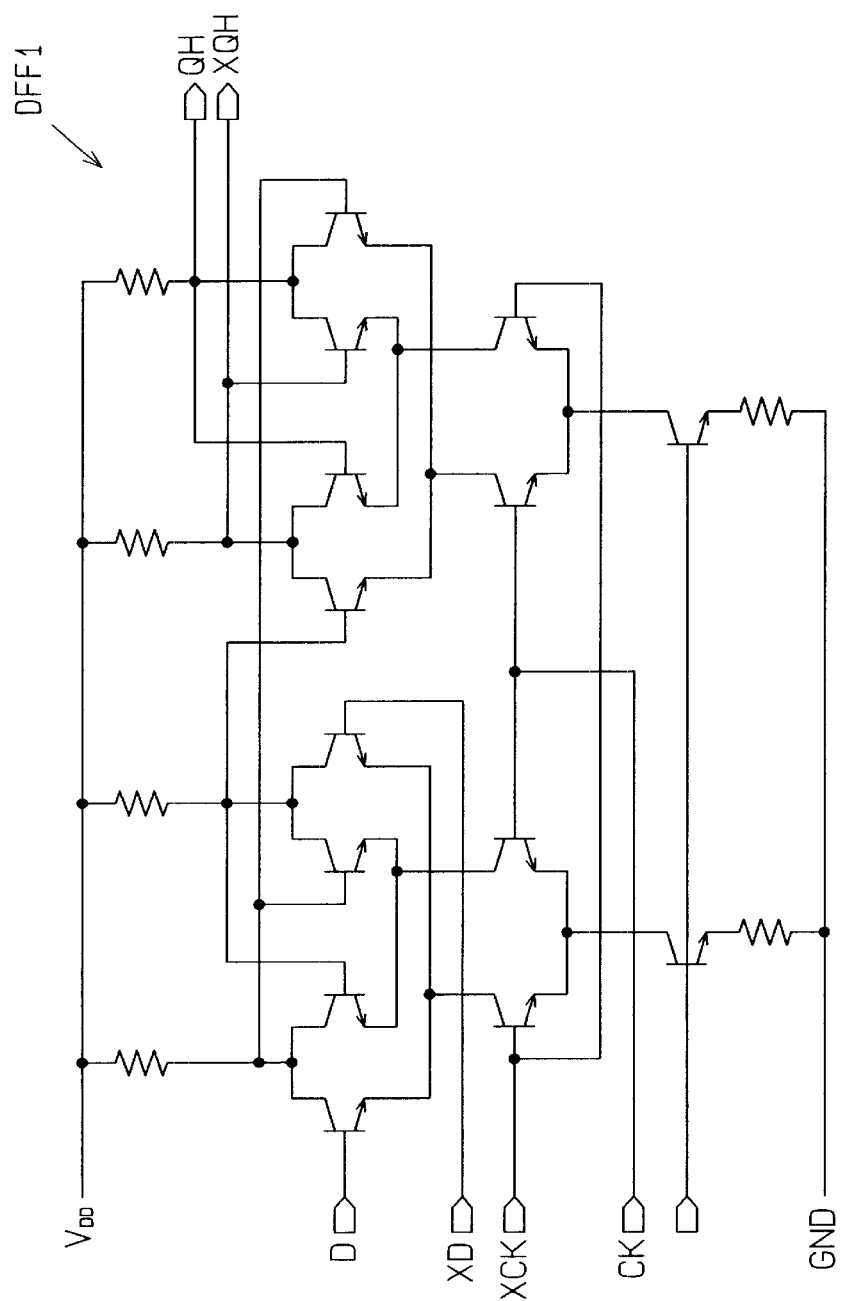
FIG. 7 is a schematic circuit diagram of a D flip-flop circuit of the prescaler of FIG. 6.
Figure 8:
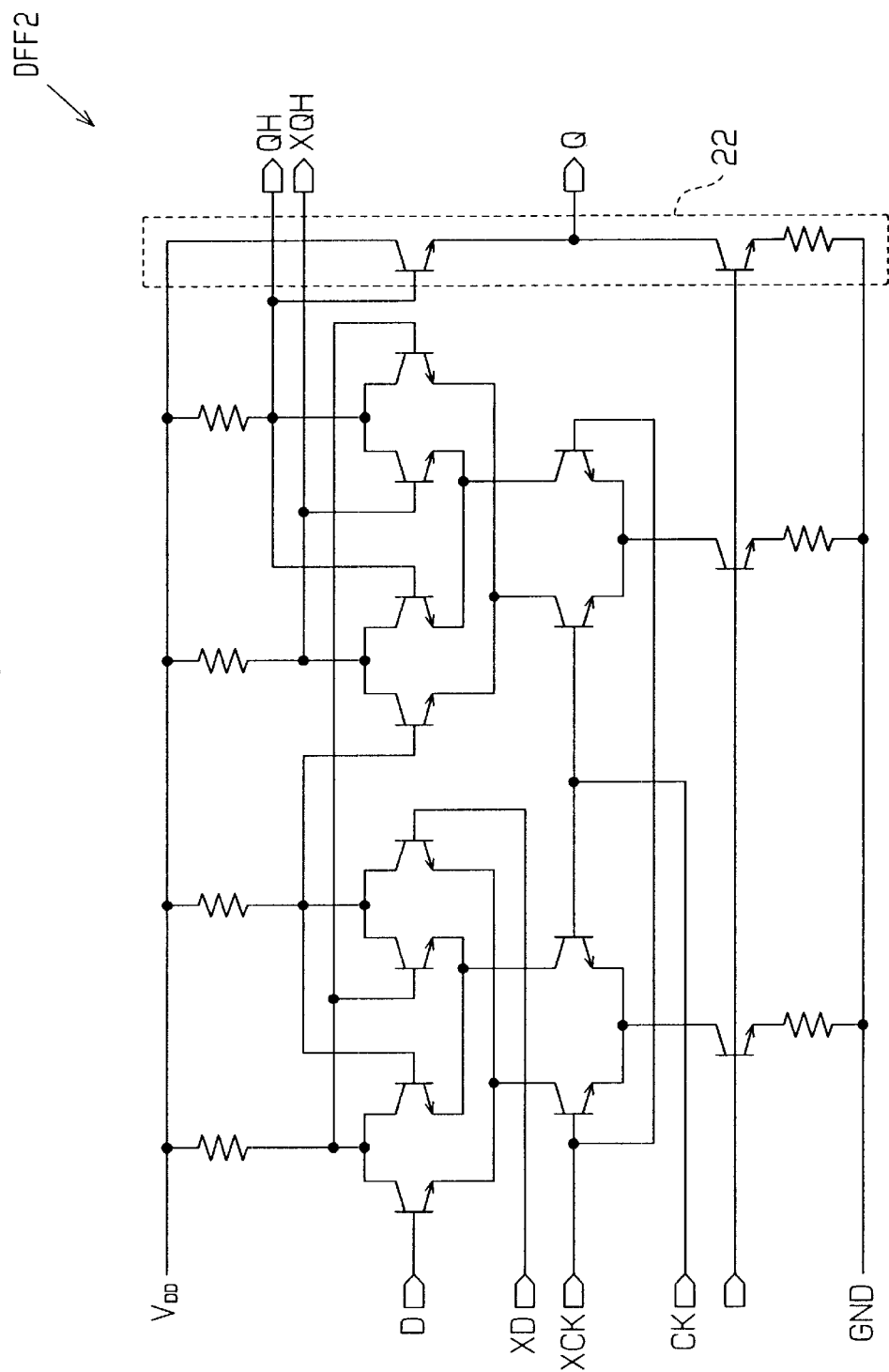
FIG. 8 is a schematic circuit diagram of another D flip-flop circuit of the prescaler of FIG. 6.

With reference to FIG. 7, the D flip-flop circuit DFF1 is a known circuit that is operated in response to input signals D, XD and input signals CK, XCK. With reference to FIG. 8, the D flip-flop circuit DFF2 includes, in addition to the configuration of the D flip-flop circuit DFF1, an output buffer 22. In the D flip-flop circuit DFF2, the phase of the output signal QH is the same as that of the output signal Q.

Referring back to FIG. 6, a bias circuit 16 provides the D flip-flop circuits DFF1, DFF2 with a reference voltage having an intermediate level of the amplitude of the input signal CK as the input signal XCK.

The extender circuit 121 functions as a Gray code counter, which divides the output signal XQ of the flip-flop circuit FF1 by four. In other words, the D flip-flop circuits DFF1, DFF2 divide the output signal XQ of the flip-flop circuit FF1 by four to generate the complementary output signals QH, XQH.

Figure 9:
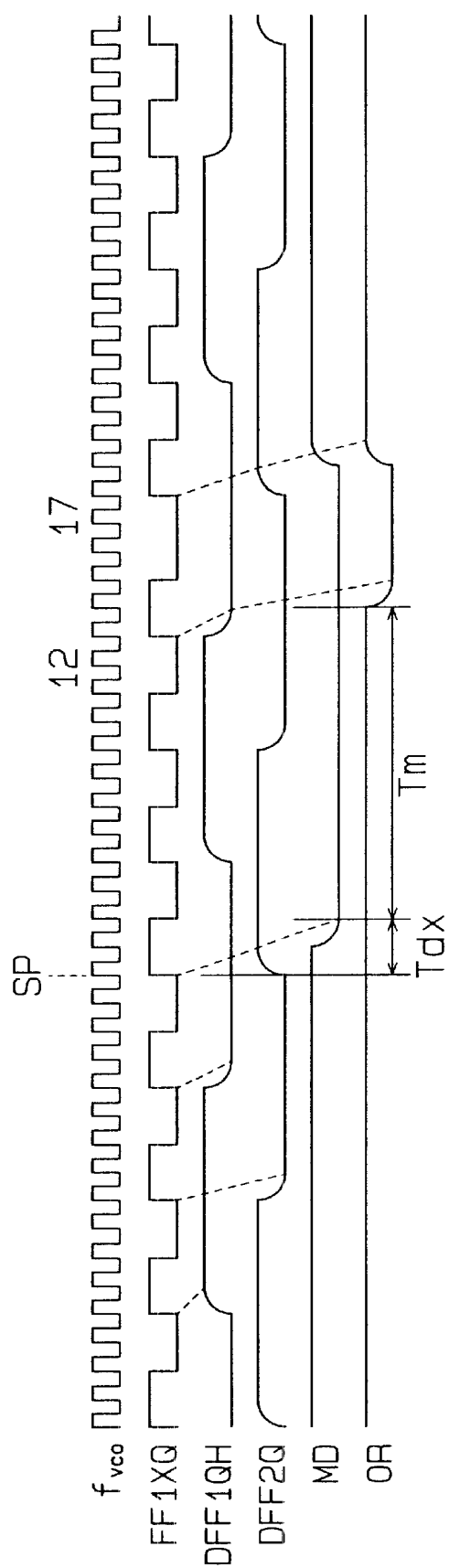
FIG. 9 is a timing chart showing the operation of the prescaler of FIG. 6.

FIG. 9 is a timing chart showing the operation of the prescaler 21a. When an oscillation output signal fvco is provided to the prescaler 21a, the operation of the flip-flop circuits FF1, FF2 causes the flip-flop circuit FF1 to divide the oscillation output signal fvco by four and generate the output signal XQ.

Output signals QH, Q of the D flip-flop circuits DFF1, DFF2 are both generated by dividing the output signal XQ of the flip-flop circuit FF1 by four, that is, by dividing the oscillation output signal fvco by sixteen. The phase of the output signal DFF1QH is offset from that of the output signal DFF2Q by one quarter of a cycle.

When the swallow counter 11 is not performing the dividing operation, the module control signal MD is high.

Thus, regardless of the output signals QH of the D flip-flop circuits DFF1, DFF2, the output signal OR of the OR circuit 14c goes high and the flip-flop circuit FF3 is deactivated. Consequently, the operation of the flip-flop circuits FF1, FF2, DFF1, DFF2 generates the first divisional signal Pout, by dividing the oscillation output signal fvco by sixteen.

When the swallow counter 11 commences the dividing operation, the module control signal MD goes low. This determines the output signal OR of the OR circuit 14c based on the output signals QH of the D flip-flop circuits DFF1, DFF2.

More specifically, from when the (M+1) divisional operation is commenced at count initiation point SP to when twelve pulses of the oscillation output signal fvco have been counted, the output signal QH of either one of the D flip-flop circuits DFF1, DFF2 is high. Thus, the output signal QH of the OR circuit 14c is high. In this state, the output signal XQH of the flip-flop circuit FF3 is fixed at a low level.

When twelve pulses of the oscillation output signal fvco have been counted, the output signals QH of the flip-flop circuits DFF1, DFF2 both go low. Thus, the output signal OR of the OR circuit 14c goes low. As a result, the flip-flop circuit FF3 is activated, and the operation of the flip-flop circuits FF1–FF3 generates the output signal XQ of the flip-flop circuit FF1 by dividing the oscillation output signal fvco by five.

Accordingly, when the module control signal MD is low, the prescaler 21a divides the oscillation output signal fvco by (M+1), or by seventeen.

In this state, a time delay Tdx occurs in the prescaler from when the division by (M+1) is commenced at the count initiation point SP to when the module control signal MD goes low.

The time delay Tdx is obtained by adding the operation time delays of the extender circuit 121, the swallow counter 11, and the control circuit 12. However, the operation time delay of the extender circuit 121 incorporating the synchronous flip-flop circuits DFF1, DFF2 is significantly shorter than the conventional extender circuit incorporating the asynchronous flip-flop circuits TFF1, TFF2.

In a counter provided with asynchronous trigger flip-flop (T flip-flop) circuits, the operation delay time of each flip-flop circuit is cumulative. In comparison, in a counter provided with synchronous D flip-flop circuits, the operation delay time of the flip-flop circuits is not cumulative. Accordingly, the delay time Tdx is significantly shorter than the delay time Td in the prior art, and the margin time Tm is extended.

The prescaler 21a and the PLL circuit of the second embodiment have the advantages described below.

(1) Since the extender circuit 121 uses a synchronous counter formed by the D flip-flop circuits DFF1, DFF2, the operation delay time of the extender circuit 121 is decreased.

(2) The shortened operation delay time of the extender circuit 121 decreases the delay time Tdx of the module control signal MD and ensures a sufficient length of margin time Tm.

(3) Since a sufficient length of margin time Tm is guaranteed, abnormal functioning during the (M+1) dividing operation is prevented even if the frequency of the oscillation output signal fvco provided to the prescaler 21a increases.

(4) Since the M frequency dividing operation and the (M+1) frequency dividing operation are both definitely performed, the lock up time of the PLL circuit is shortened.

[Third Embodiment]

Figure 10:
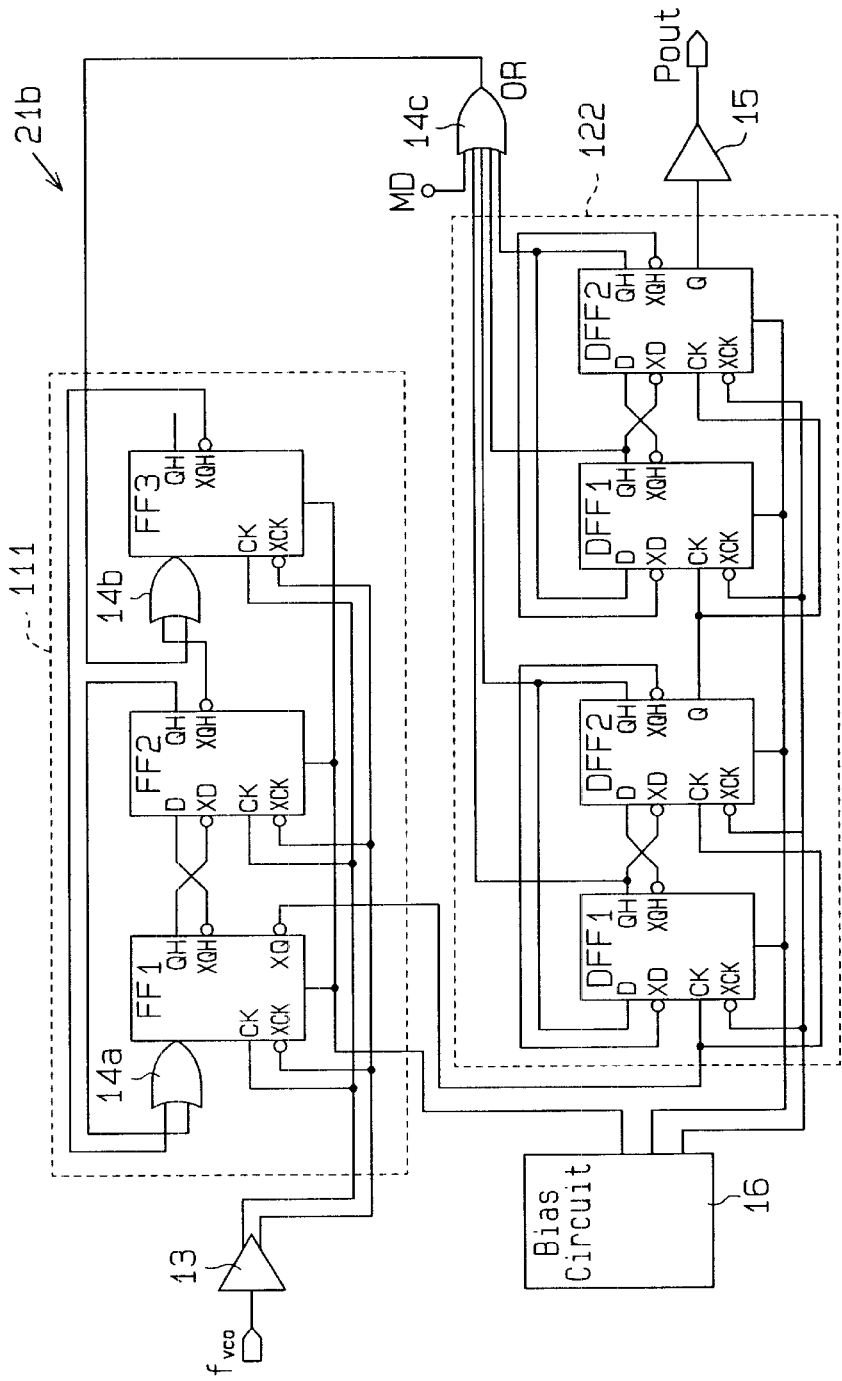
FIG. 10 is a schematic block diagram of a prescaler according to a third embodiment of the present invention.

FIG. 10 is a schematic block diagram showing a prescaler 21b according to a third embodiment of the present invention.

The prescaler 21b divides frequencies by 64 and by (64+1). The extender circuit 122 is a synchronous counter using two sets of the D flip-flop circuits DFF1, DFF2.

In the third embodiment, the operation delay time of the extender circuit 122 is obtained by adding the operation time delays of the two D flip-flop circuits. In comparison with an extender circuit including an asynchronous counter provided with four asynchronous flip-flop circuits, the delay time of the module control signal MD is shortened by the extender circuit 122 of the third embodiment.

[Fourth Embodiment]

Figure 11:
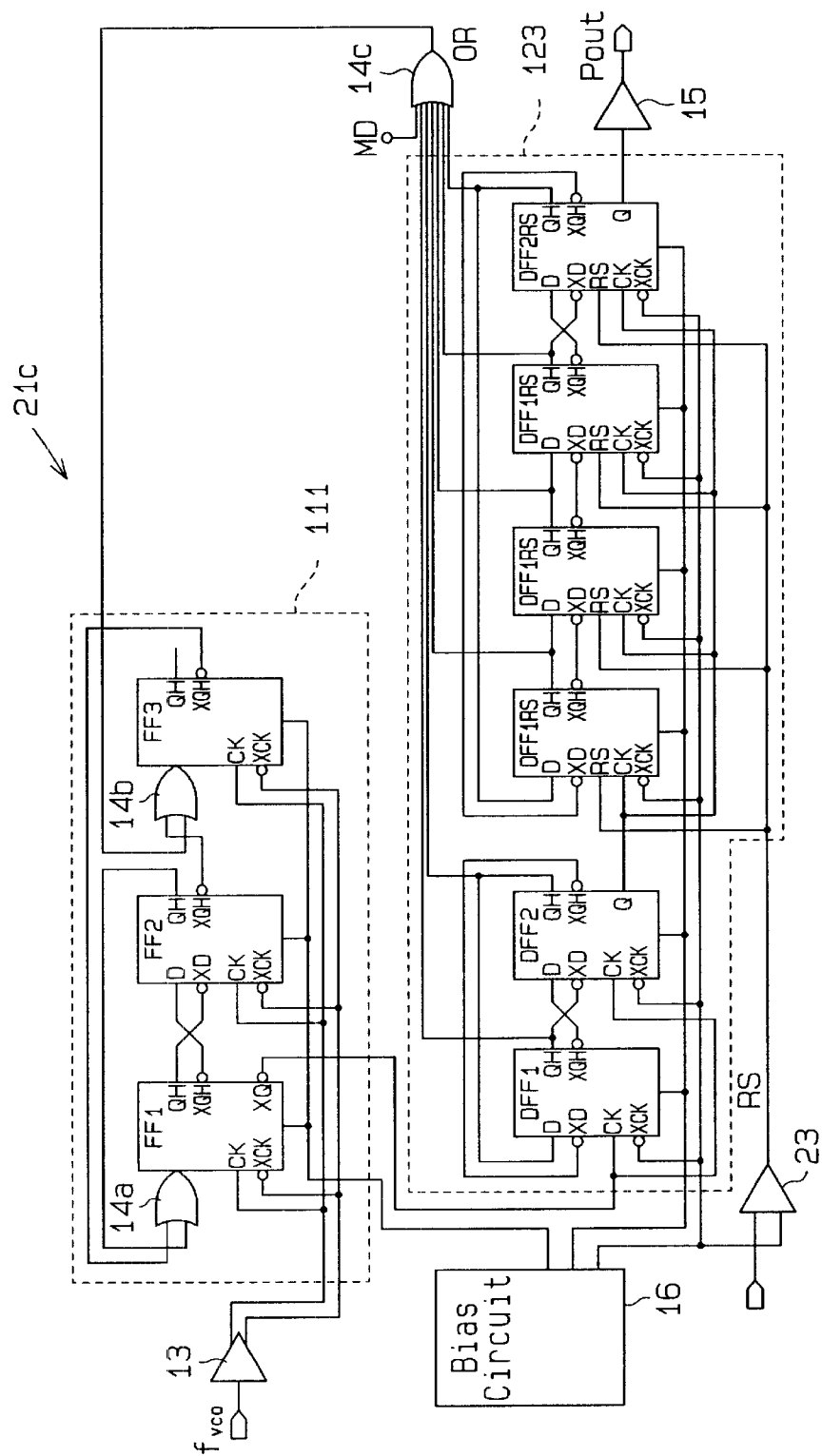
FIG. 11 is a schematic block diagram of a prescaler according to a fourth embodiment of the present invention.

FIG. 11 is a schematic block diagram showing a prescaler 21c according to a fourth embodiment of the present invention. The prescaler 21c divides frequencies by 128 and by (128+1). In the fourth embodiment, the extender circuit 123 is a Johnson counter, which divides frequencies by eight. The Johnson counter is connected to the D flip-flop circuits DFF1, DFF2 of the second embodiment and includes three D flip-flop circuits DFF1RS and one flip-flop circuit DFF2RS.

The Johnson counter cannot obtain a normal division ratio if each flip-flop circuit does not latch the appropriate data when the power goes on. Therefore, the prescaler 21c of the fourth embodiment is provided with a clear circuit 23, which provides each of the D flip-flop circuits DFF1RS, DFF2RS with a reset signal RS when the power goes on.

Figure 12:
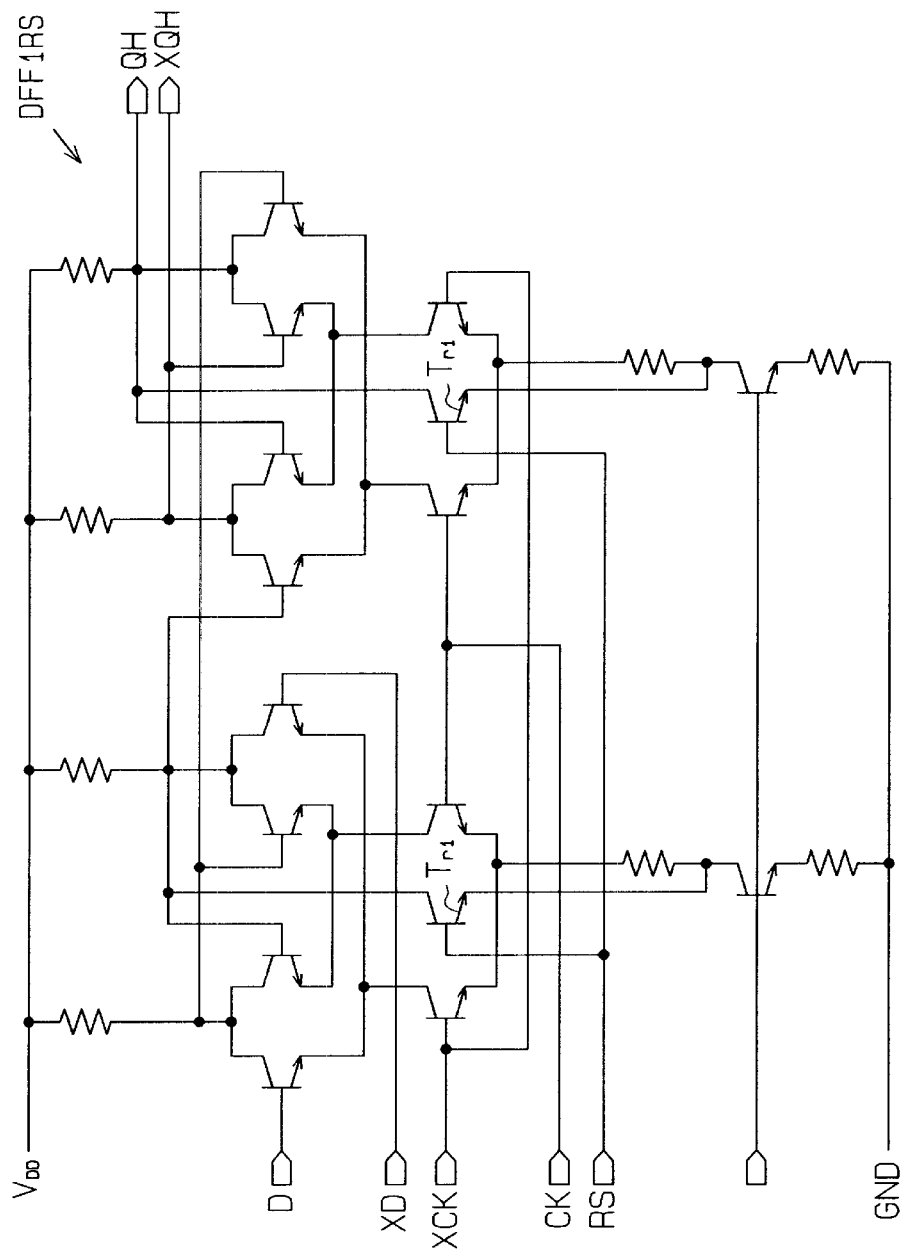
FIG. 12 is a schematic circuit diagram of a D flip-flop circuit of the prescaler of FIG. 11.
Figure 13:
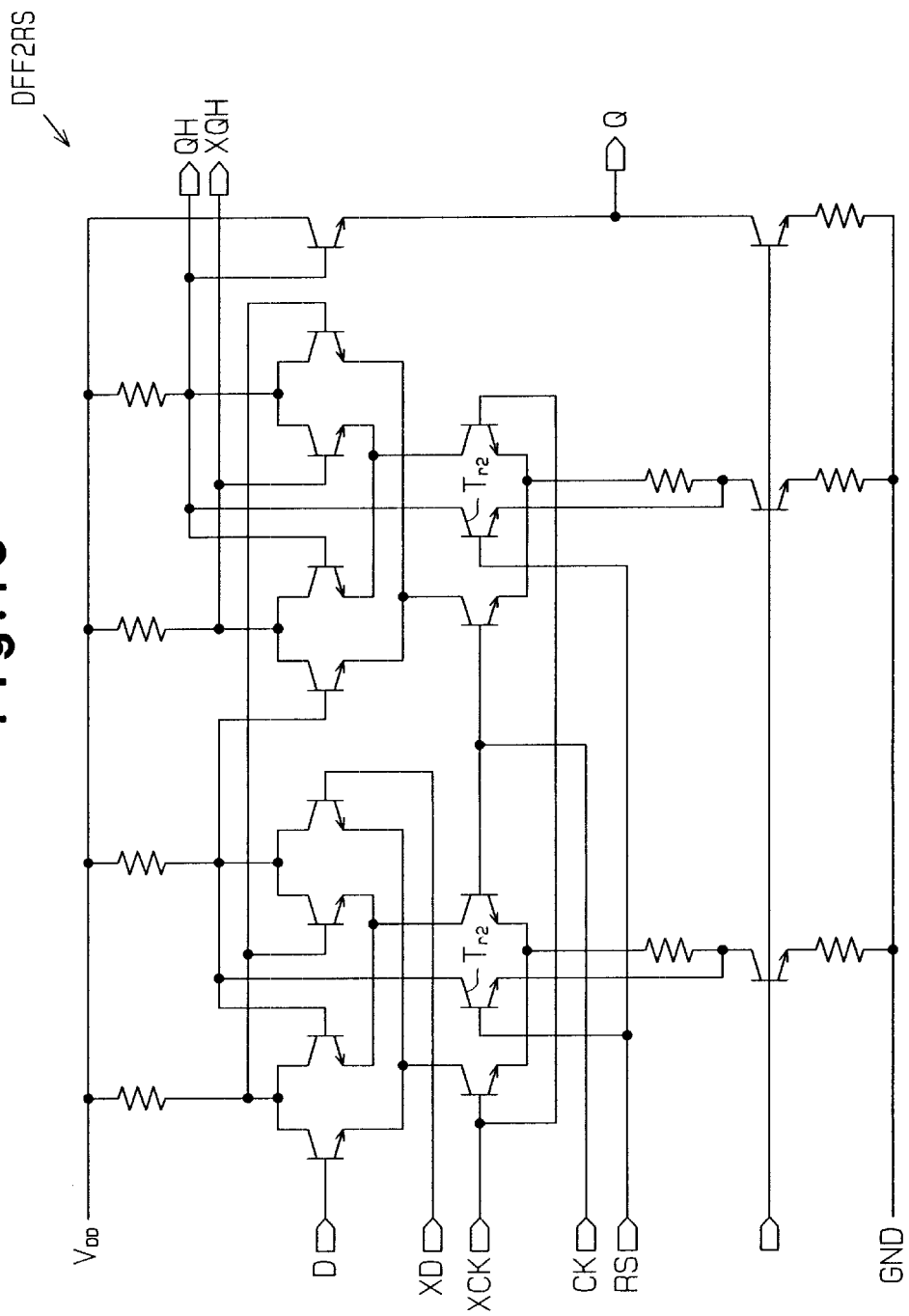
FIG. 13 is a schematic circuit diagram of another D flip-flop circuit of the prescaler of FIG. 11.

FIG. 12 is a schematic circuit diagram showing the flip-flop circuit DFF1RS, and FIG. 13 is a schematic circuit diagram showing the D flip-flop circuit DFF2RS. As shown in FIG. 12, the D flip-flop circuit DFF1RS is formed by adding a reset transistor Tr1 to the D flip-flop circuit DFF1 of FIG. 7. The D flip-flop circuit DFF2RS shown in FIG. 13 is formed by adding a reset transistor Tr2 to the D flip-flop circuit DFF2 of FIG. 8.

In the flip-flop circuits DFF1RS, DFF2RS, the respective transistors Tr1, Tr2 are activated in response to a high reset signal. This resets the output signal of the associated flip-flop circuit.

In the fourth embodiment, the operation delay time of the extender circuit 123 is obtained by adding the operation delay time of the two D flip-flop circuits. Therefore, in comparison with an extender circuit that includes an asynchronous counter provided with six asynchronous flip-flops, the delay time of the module control signal MD in the extender circuit of the fourth embodiment is shorter.

[Fifth Embodiment]

Figure 14:
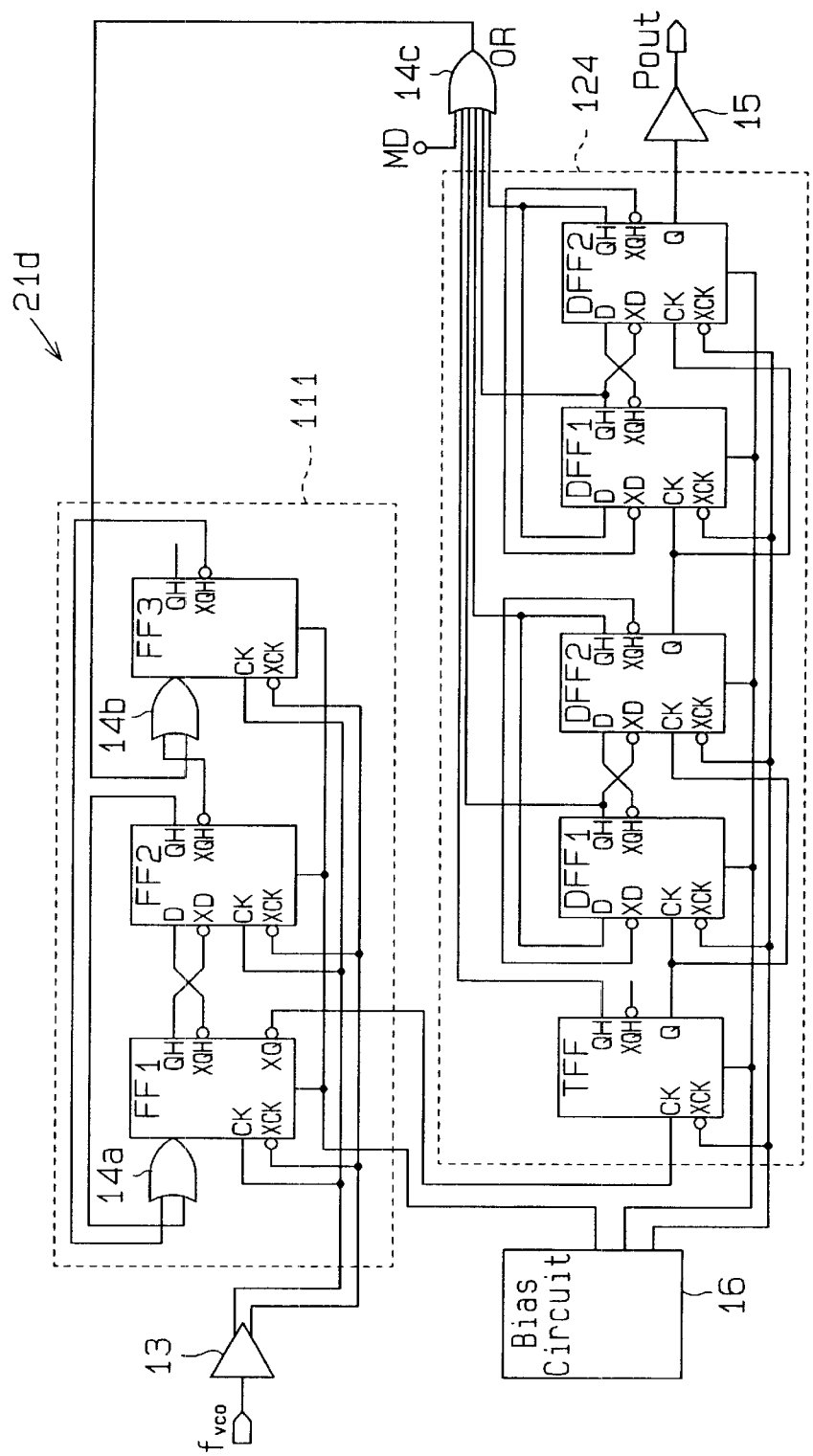
FIG. 14 is a schematic block diagram of a prescaler according to a fifth embodiment of the present invention.

FIG. 14 is a schematic circuit diagram of a prescaler 21d according to a fifth embodiment of the present invention. The prescaler 21d divides frequencies by 128 and by (128+1). In this embodiment, the extender circuit 124 is a counter having a T flip-flop circuit TFF connected between the D flip-flop circuit DFF1 and the flip-flop circuit FF1 of the frequency division shifting circuit 111. In the fifth embodiment, the operation delay time of the extender circuit 124 is obtained by adding the delay time of the T flip-flop circuit and the delay time of the two D flip-flop circuits.

Hence, in comparison with an extender circuit including an asynchronous counter provided with one T flip-flop circuit and four asynchronous flip-flops, the delay time of the module control signal MD in the extender circuit 124 of the fifth embodiment is shorter.

The extender circuit 124 of the fifth embodiment uses the T-type flip-flop circuit TFF. Thus, in comparison with an extender circuit provided with only synchronous flip-flop circuits, the number of which is necessary to obtain the division ratio of the fifth embodiment, the extender circuit 124 of the fifth embodiment has a smaller circuit area.

It should be apparent to those skilled in the art that the present invention may be embodied in many other specific forms without departing from the spirit or scope of the invention. Particularly, it should be understood that the present invention may be embodied in the following forms.

The synchronous counter used in the extender circuit 124 may be a Gray code counter, a Johnson counter, or a ring counter.

The present examples and embodiments are to be considered as illustrative and not restrictive, and the invention is not to be limited to the details given herein, but may be modified within the scope and equivalence of the appended claims.

What is claimed is:

1. A prescaler comprising:
    a frequency division shifting circuit for shifting a frequency division ratio in response to a frequency division ratio shifting signal and dividing an input signal in accordance with the shifted frequency division ratio to generate a first divisional signal; and
    an extender circuit connected to the frequency division shifting circuit for dividing a frequency of the first divisional signal with a predetermined frequency division ratio to generate a second divisional signal, wherein the extender circuit includes an asynchronous counter connected to a synchronous counter.

2. The prescaler according to claim 1, wherein the synchronous counter includes a plurality of synchronous D flip-flop circuits.

3. The prescaler according to claim 2, wherein the asynchronous counter includes an asynchronous T flip-flop circuit.

4. A PLL circuit comprising:
    a reference frequency divider for dividing a frequency of a reference clock signal to generate a reference signal;
    a phase comparator connected to the reference frequency divider for comparing a phase of the reference signal with a phase of a comparison signal to generate a phase comparison signal;
    a charge pump connected to the phase comparator for converting the phase comparison signal to a voltage signal;
    a low-pass filter connected to the charge pump for smoothing the voltage signal and generating a smooth signal;
    a voltage-controlled oscillator connected to the low-pass filter for generating an oscillation output signal having a frequency corresponding to the voltage of the smooth signal; and
    a comparison frequency divider connected to the voltage-controlled oscillator and the phase comparator for dividing the frequency of the oscillation output signal to generate the comparison signal, wherein the comparison frequency divider includes,
        a prescaler for dividing the frequency of the oscillation output signal with a frequency division ratio corresponding to a module control signal to generate a prescaler divisional signal,
        a main counter connected to the prescaler for dividing the frequency of the prescaler divisional signal to generate the comparison signal,
        a swallow counter connected to the prescaler to divide the frequency of the prescaler divisional signal to generate a swallow counter divisional signal, and
        a control circuit connected to the swallow counter and the main counter for generating the module control signal in accordance with the comparison signal and the swallow counter divisional signal, wherein the prescaler includes,
            a frequency division shifting circuit for shifting the frequency division ratio in response to a frequency division ratio shifting signal and dividing an input signal in accordance with the shifted frequency division ratio to generate a first divisional signal, and
            an extender circuit connected to the frequency division shifting circuit for dividing a frequency of the first divisional signal with a predetermined frequency division ratio to generate a second divisional signal, wherein the extender circuit includes an asynchronous counter connected to a synchronous counter.

5. The PLL according to claim 4, wherein the synchronous counter includes a plurality of synchronous D flip-flop circuits.

6. The PLL according to claim 5, wherein the asynchronous counter includes an asynchronous T flip-flop circuit.

* * * * *